US005990989A

United States Patent [19]
Ozawa

[11] Patent Number: 5,990,989
[45] Date of Patent: *Nov. 23, 1999

[54] NOISE-SHIELD SHEET AND LIQUID CRYSTAL DISPLAY DEVICE USING THE SAME

[75] Inventor: Takaaki Ozawa, Suwa, Japan

[73] Assignee: Seiko Epson Corporation, Tokyo, Japan

[*] Notice: This patent is subject to a terminal disclaimer.

[21] Appl. No.: 09/108,304

[22] Filed: Jul. 1, 1998

Related U.S. Application Data

[62] Division of application No. 08/622,601, Mar. 26, 1996, Pat. No. 5,805,251.

[30] Foreign Application Priority Data

Mar. 31, 1995 [JP] Japan .................................... 7-100553

[51] Int. Cl.[6] ...................... G02F 1/1335; G02F 1/1333; G02F 1/1345; H05K 9/00; F21V 19/04
[52] U.S. Cl. .............................. 349/61; 349/62; 349/110; 349/152; 362/31; 361/818
[58] Field of Search .................................. 349/110, 138, 349/61.2; 361/818, 816; 174/36, 35 R; 362/31, 32

[56] References Cited

U.S. PATENT DOCUMENTS

| | | | |
|---|---|---|---|
| 4,661,889 | 4/1987 | Fushimoto | 361/818 |
| 4,683,519 | 7/1987 | Murakami | 361/600 |
| 5,164,542 | 11/1992 | Hart | 174/35 MS |
| 5,264,992 | 11/1993 | Hogdahl et al. | 361/818 |
| 5,265,265 | 11/1993 | Hama et al. | 361/818 |
| 5,338,897 | 8/1994 | Tsay et al. | 174/35 R |
| 5,564,096 | 10/1996 | Hama et al. | 361/818 |
| 5,731,964 | 3/1998 | Kitakubo et al. | 361/816 |
| 5,774,199 | 6/1998 | Ozawa | 349/149 |

FOREIGN PATENT DOCUMENTS

| | | |
|---|---|---|
| A-58-72984 | 5/1983 | Japan . |
| U-61-49380 | 4/1986 | Japan . |
| U-62-181931 | 11/1987 | Japan . |
| 6-29690 | 2/1994 | Japan . |

*Primary Examiner*—William L. Sikes
*Assistant Examiner*—Toan Ton
*Attorney, Agent, or Firm*—Oliff & Berridge, PLC

[57] ABSTRACT

There are provided a noise-shield sheet which can easily add a shield layer without complicating the wiring on a circuit board and which can prevent a short-circuiting between the shield layer and the electronic part's lead and connection terminals, and a liquid crystal display device using such a noise-shield sheet. The noise-shield sheet has holes each of which permits an electric component protruding from the surface of the circuit board to be passed through the hole and is mounted on the circuit board to avoid noise. The noise-shield sheet is made up of an insulating base layer and a shield layer of electrically conductive material formed on the insulating layer. Each of the holes has a first hole formed by etching the shield layer and a second hole formed by the insulating layer within the first hole at a position separate from the edge of the shield layer.

3 Claims, 15 Drawing Sheets

NOISE-SHIELD SHEET AND LIQUID CRYSTAL DISPLAY DEVICE USING THE SAME

This is a Division of application Ser. No. 08/622,601 filed Mar. 26, 1996 now U.S. Pat. No. 5,805,251. The entire disclosure of the prior application(s) is hereby incorporated by reference herein in its entirety.

BACKGROUND OF THE INVENTION

1. Field of the Invention

The present invention relates to a noise-shield sheet and a liquid crystal display device using such a noise-shield sheet. More particularly, the present invention relates to a noise-shield sheet which can shield without any complicated wiring and a liquid crystal display device using such a noise-shield sheet.

2. Description of the Prior Art

The background art of the present invention provides a liquid crystal display device shown in FIG. 18, for example.

Such a liquid crystal display device is small sufficient to be a display module in pagers and cameras. The liquid crystal display device comprises a metallic frame 10 in which a liquid crystal display panel 12, a reflector 14 and a circuit board 16 are mounted.

The circuit board 16 includes a lamp 18 which radiates a light from the side edge of the liquid crystal display panel 12. The light is then reflected by the reflector 14 from the backside of the liquid crystal display panel 12 to provide a back light.

The bottom surface of the liquid crystal display panel 12 and the top surface of the circuit board 16 respectively include connecting terminals 20 and 22 which are separated from one another along one longitudinal side of the respective members. These connecting terminals 20 and 22 are connected to one another through an electrically conductive rubber 24 between the liquid crystal display panel 12 and the circuit board 16.

In such a case, it is required to prevent such elements as the mother board from adverse effects of noise from the circuit board 16, since the circuit board 16 is connected to the mother board or the like.

To meet such a requirement, for example, the circuit board 16 may be multi-layered and the shield layers are formed on the top and bottom surfaces of each outermost layer of the board. The outermost shield layers are connected to each other by means of holes.

Alternatively, copper foils may be applied to the top and bottom surfaces of the circuit board and connected to each other through soldering or single-sided boards each having a whole pattern may be applied on the top and bottom surfaces of the circuit board and connected to each other through conductors.

When the circuit board 16 is multi-layered and if the wiring on the multi-layered board is complicated, the shield layers cannot be formed on the outermost layers of the multi-layered board.

Such a multi-layered board raises another problem in that it is substantially expensive.

When the copper foils are applied to the circuit board and connected to each other through the soldering as described, the copper foils should be formed with holes used to avoid various electronic parts and connection terminals on the circuit board 16. However, it is difficult to accurately position and form these holes. If the holes are formed slightly out of their proper positions, the copper foil portions will be exposed in the holes. This tends to create a short-circuiting between the electronic parts and the copper foils.

When the single-sided boards are applied to the top and bottom surfaces of the circuit board 16 and connected to each other through conductors or when the copper foils are connected to each other through the soldering, it raises a further problem in that tedious connecting or soldering operation is required.

SUMMARY OF THE INVENTION

It is therefore an object of the present invention to provide a noise-shield sheet which can easily add a shield layer without making the circuit board wiring complicated and a liquid crystal display device using such a noise-shield sheet.

Another object of the present invention is to provide a noise-shield sheet which prevents any short circuit between the shield layer and the electronic parts such as leads and connection terminals, even when the noise-shield sheet has holes for avoiding the electronic parts and the connection terminals, and a liquid crystal display device using such a noise-shield sheet.

A further object of the present invention is to provide a liquid crystal display device into which a noise-shield sheet can be more easily incorporated and omits time and operation required for soldering and lead connection.

The present invention provides a noise-shield sheet comprising:
- an insulating base layer opposite to the surface of a circuit board mounting electric components;
- a shield layer of electrically conductive material formed on the insulating layer; and
- holes formed through the insulating and shield layers for allowing the electric components to pass,
- each of the holes being larger on the side of the shield layer than the ones on the side of the insulating layer.

Electric components inserted into a hole may contact the corresponding hole on the insulating layer side that is smaller than the hole on the shield layer side. Nevertheless, a short circuit between the noise-shield sheet and the electric components may be prevented, since the electric components do not contact the hole on the shield layer side.

It is preferred that each of the holes comprises a first hole formed by etching the shield layer and a second hole punched through the insulating layer within the first hole at a position separate from the edge of the shield layer.

Thus, the first hole can be easily and reliably formed to be larger than the second hole on the insulating layer side, thereby positively avoiding the electric components inserted through the hole from being short-circuited with the shield layer.

It is also preferred that the insulating layer is formed of a flexible material and that the shield layer is printed on the insulating layer.

Thus, the noise-shield sheet can be easily matched to the configuration of the assembly.

It is further preferred that an insulating adhesive for adhering the circuit board is applied to an exposing surface of the insulating layer.

Thus, the noise-shield sheet can be easily mounted on the circuit board.

The present invention also provides a liquid crystal display device, comprising:
- a circuit board mounting electric components on the top surface thereof and an electrically conductive pattern on the opposite surface thereof;

a liquid crystal display panel including a central display area and electrode terminals disposed along the sides thereof and connected to the electrically conductive pattern, the liquid crystal display panel being opposite to the circuit board;

elastic conductors located and compressed between the circuit board and the liquid crystal display panel to connect the electrically conductive pattern to the electrode terminals;

a lamp for radiating a light toward the liquid crystal display panel;

and a light guide plate disposed between the circuit board and the liquid crystal display panel for conducting the light from the lamp toward the central display area; and wherein the light guide plate includes positioning portions for positioning the elastic conductors which are formed therein on the opposite ends, the positioning portions having a height equal to or lower than that of the compressed elastic conductors, each of the positioning portions has a protrusion extending therefrom toward the circuit board;

the lamp is placed between at least one of the positioning portions and the central display area; and a noise-shield sheet is located in a space between the light guide plate and circuit board formed by the protrusions.

When the noise-shield sheet is disposed within the space formed between the circuit board and the positioning portions of the light guide plate, the noise-shield sheet can be more easily positioned in the liquid crystal display device.

It is further preferred that the noise-shield sheet comprises an insulating base layer; a shield layer of electrically conductive material formed on the insulating layer; and holes formed through the insulating and shield layers for allowing electric components mounted on the top surface of the circuit board to pass; and wherein each of the holes is larger on the side of the shield layer than the ones on the side of the insulating layer.

Thus, a short circuit between the electric components mounted on the circuit board and the shield layer can be reliably prevented.

It is further preferred that the insulating layer is disposed opposite to the surface of the circuit board.

Thus, the shield layer will not directly contact the circuit board surface. Therefore, the short circuit between the circuit board and the electric components can be more reliably prevented.

It is preferred in the liquid crystal display device that each of the holes comprises a first hole formed by etching the shield layer and a second hole punched through the insulating layer within the first hole at a position separate from the edge of the shield layer.

Thus, the first hole can be easily and reliably formed to be larger than the second hole on the insulating layer side, thereby positively avoiding the electric components inserted through the hole from being short-circuited with the shield layer.

It is also preferred in the liquid crystal display device that the insulating layer is formed of a flexible material and that the shield layer is printed on the insulating layer.

Thus, the noise-shield sheet can be easily matched to the configuration of the assembly.

It is further preferred in the liquid crystal display device that an insulating adhesive for adhering the circuit board is applied to an exposing surface of the insulating layer.

Thus, the noise-shield sheet can be easily mounted on the circuit board.

It is further preferred in the liquid crystal display device that the circuit board and noise-shield sheet include positioning holes formed therethrough at positions opposite to each other.

Thus, the noise-shield sheet can be more easily positioned relative to the circuit board simply by inserting any suitable jig or tool into the positioning holes in the circuit board and noise-shield sheet.

In the other aspect of the present inventions it provides a liquid crystal display device, comprising:

a circuit board mounting electric components on the top surface thereof and an electrically conductive pattern on the opposite surface thereof;

a liquid crystal display panel including a central display area and electrode terminals disposed along the sides thereof and connected to the electrically conductive pattern, the liquid crystal display panel being opposite to the circuit board;

elastic conductors located and compressed between the circuit board and the liquid crystal display panel to connect the electrically conductive pattern to the electrode terminals;

a lamp for radiating a light toward the liquid crystal display panel;

a light guide plate disposed between the circuit board and the liquid crystal display panel for conducting the light from the lamp toward the central display area; and wherein the light guide plate includes positioning portions for positioning the elastic conductors which are formed therein on the opposite ends, the positioning portions having a height equal to or lower than that of the compressed elastic conductors;

each of the positioning portions has a protrusion extending therefrom toward the circuit board;

the lamp is placed between at least one of the positioning portions and the central display area; and a noise-shield sheet is angled around the circuit board to shield noise generated from the top and opposite surfaces and one portion of the noise-shield sheet opposite to the top surface is located in a space between the light guide plate and the circuit board formed by the protrusions.

In such an arrangement, the shield layer can be more easily incorporated into the liquid crystal display device without any soldering or lead connection.

It is preferred in this arrangement that the noise-shield sheet comprises an insulating base layer; a shield layer of electrically conductive material formed on the insulating layer; and holes formed through the insulating and shield layers for allowing the electric components which protrude from the top surface of the circuit board to pass, each of the holes being larger on the side of the shield layer than the ones on the side of the insulating layer.

Thus, a short circuit between the electric components of the circuit board and the shield layer can be more positively avoided.

It is further preferred in this embodiment that the insulating layer is disposed opposite to the top and opposite surfaces of the circuit board.

Thus, the shield layer will not directly contact the surface of the circuit board to more positively avoid the short circuit between the circuit board and the electric components.

It is further preferred in this embodiment that each of the holes comprises a first hole formed by etching the shield layer and a second hole punched through the insulating layer within the first hole at a position separate from the edge of the shield layer.

Thus, the first hole can be easily and reliably formed to be larger than the second hole on the insulating layer side, thereby positively avoiding the electric components inserted through the hole from being short-circuited with the shield layer.

It is also preferred in this embodiment that the insulating layer is formed of a flexible material and the shield layer is printed on the insulating layer.

Thus, the noise-shield sheet can be easily matched to the configuration of the assembly.

It is further preferred in this embodiment that an insulating adhesive for adhering the circuit board is applied to an exposing surface of the insulating layer.

Thus, the noise-shield sheet can be easily be mounted on the circuit board.

It is further preferred in this embodiment that the circuit board and noise-shield sheet include positioning holes formed therethrough at positions opposite to each other.

Thus, the noise-shield sheet can be more easily positioned relative to the circuit board simply by inserting any suitable jig or tool into the positioning holes in the circuit board and noise-shield sheet.

DETAILED DESCRIPTION OF THE PREFERRED EMBODIMENTS

Preferred embodiments of the present invention will now be described with reference to the drawings.

FIGS. 1 to 12 show one embodiment of a liquid crystal display device constructed in accordance with the present invention.

Figure 3:
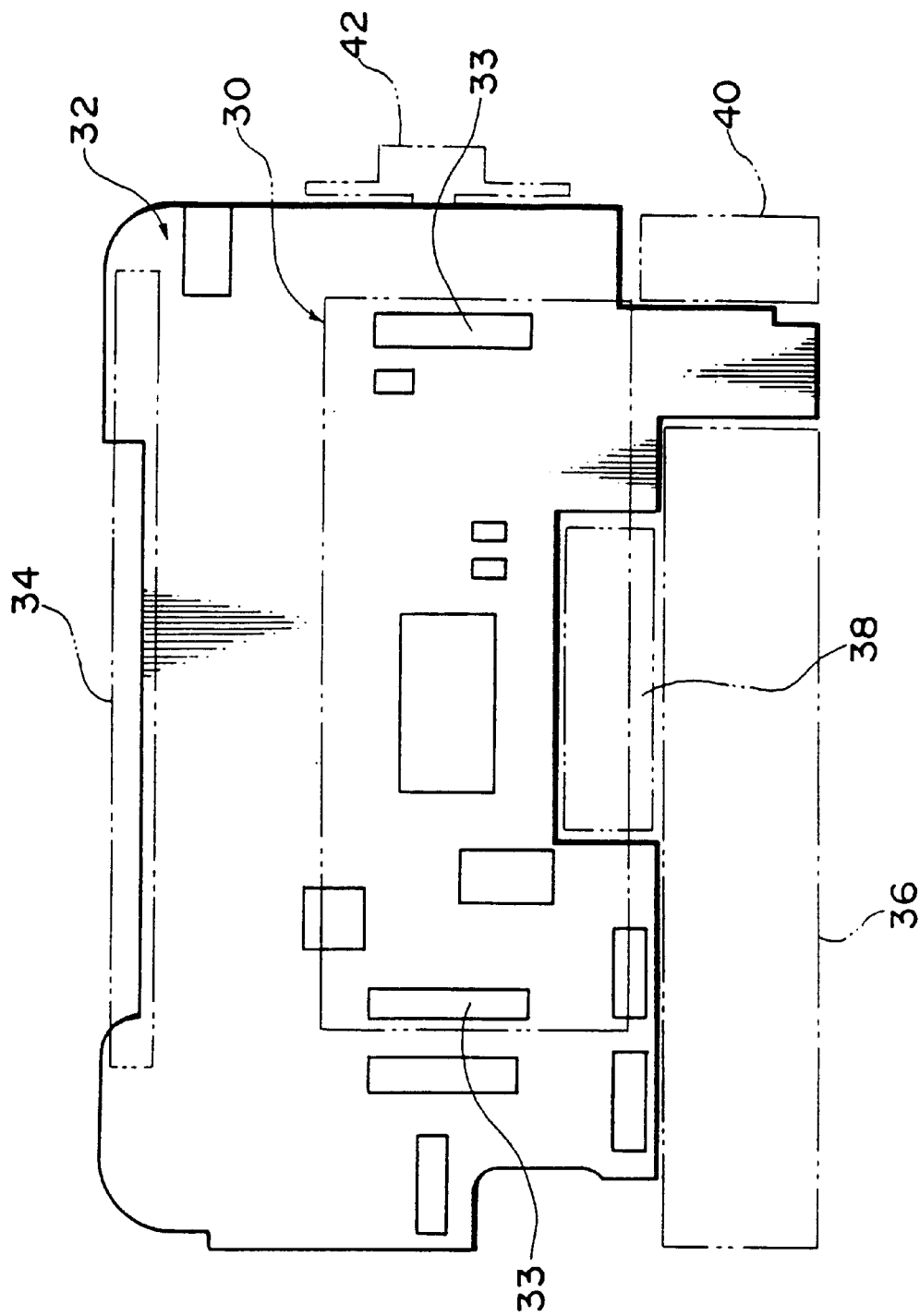
FIG. 3 is a plan view showing a mother board on which the liquid crystal display device of FIGS. 1 and 2 is mounted.
Figure 4:
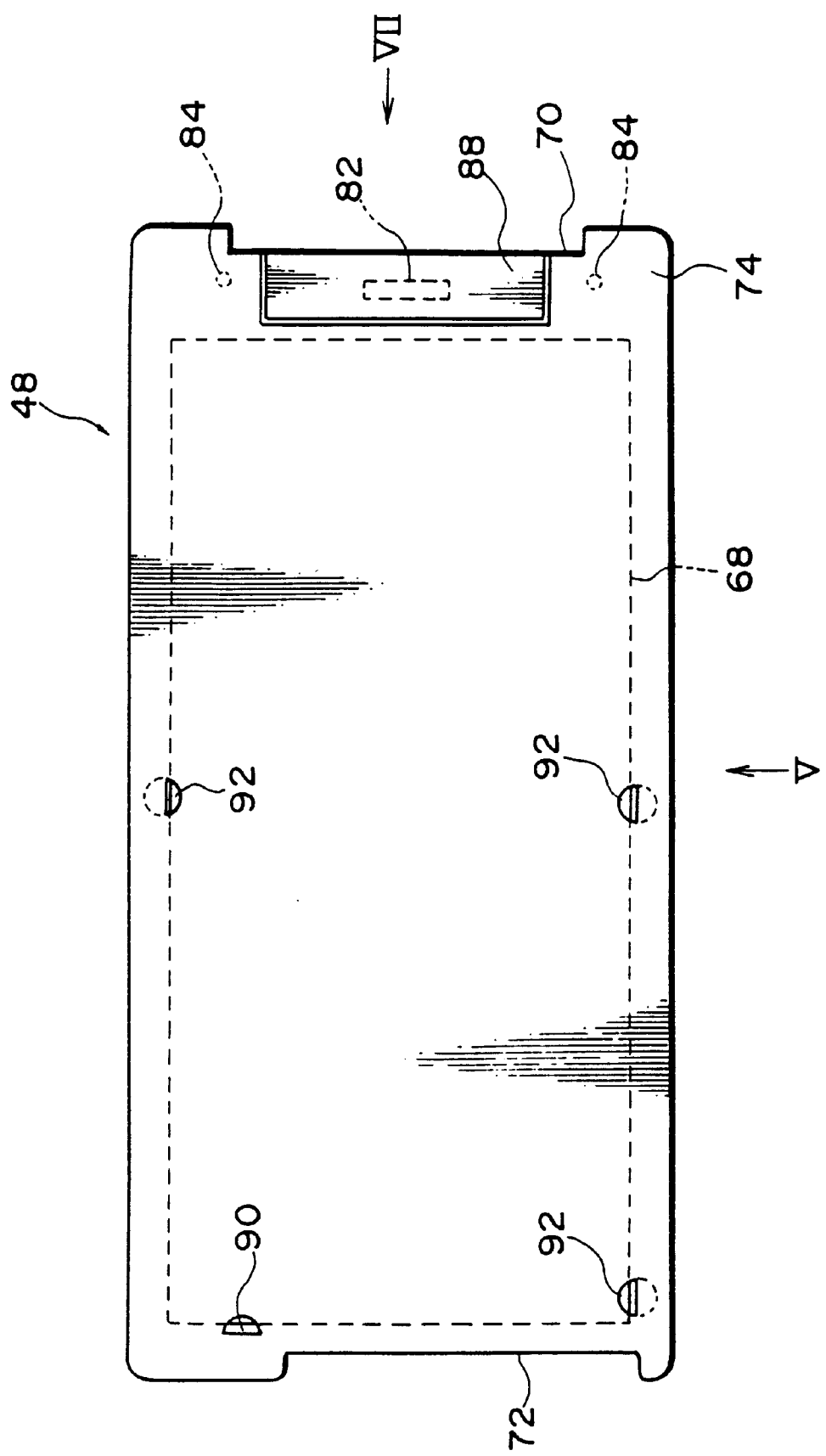
FIG. 4 is a front view of the light guide plate shown in FIGS. 1 and 2.

The liquid crystal display device 30 is used as a display module in a pager and is mounted on a mother board 32 in the pager body through female connectors 33, as shown in FIG. 3.

The pager body includes such elements as an antenna 34, a battery 36, a vibrator 38, a buzzer 40, and a slide switch 42.

Figure 1:
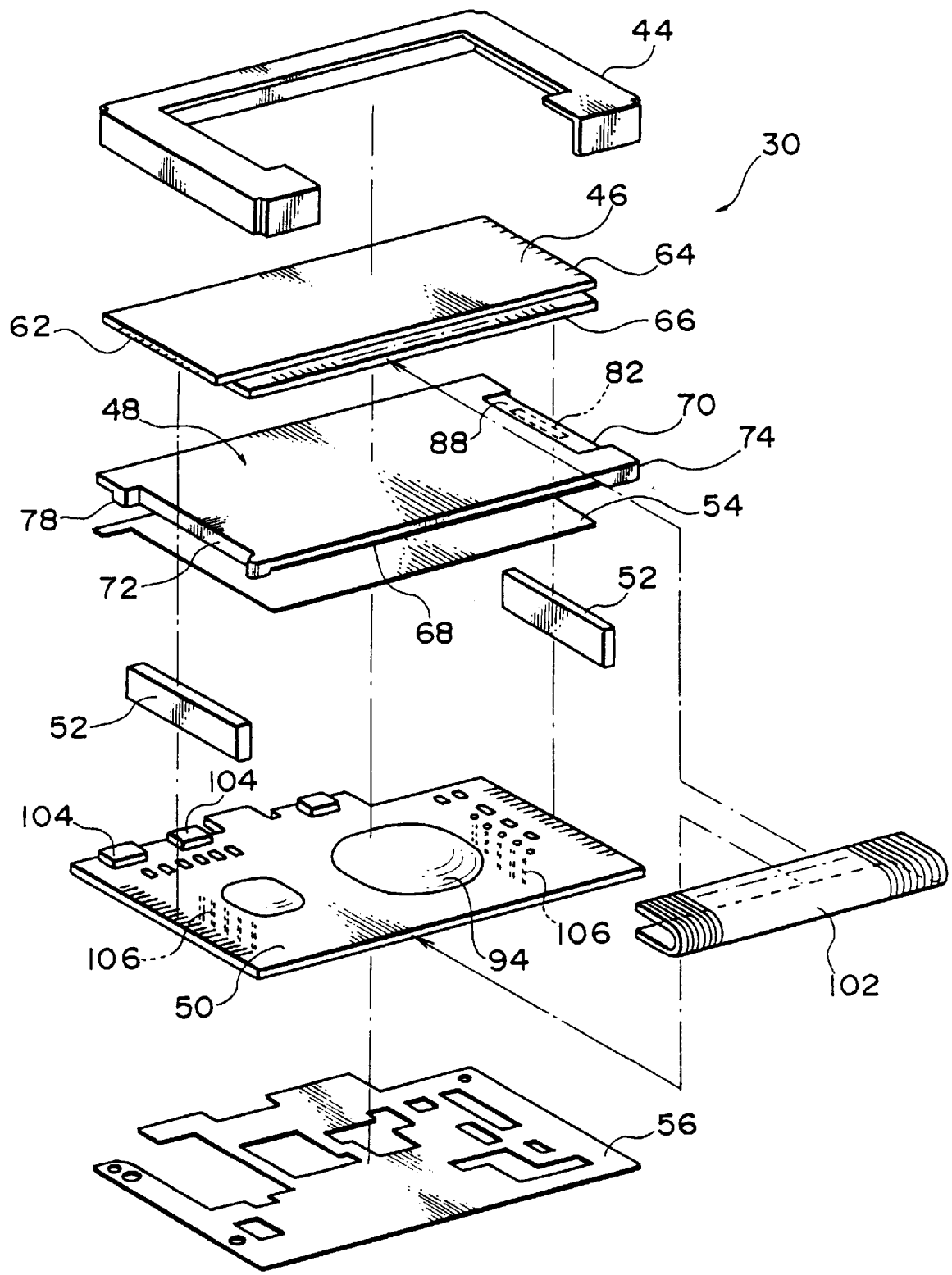
FIG. 1 is an exploded perspective view of one embodiment of a liquid crystal display device constructed in accordance with the present invention.

As shown in FIG. 1, the liquid crystal display device 30 comprises a substantially inverted C-shaped metallic frame 44 into which such components as a liquid crystal display panel 46, a light guide plate 48, a circuit board 50, elastic conductors 52, first and second noise-shield sheets 54, 56 are incorporated.

Figure 9:
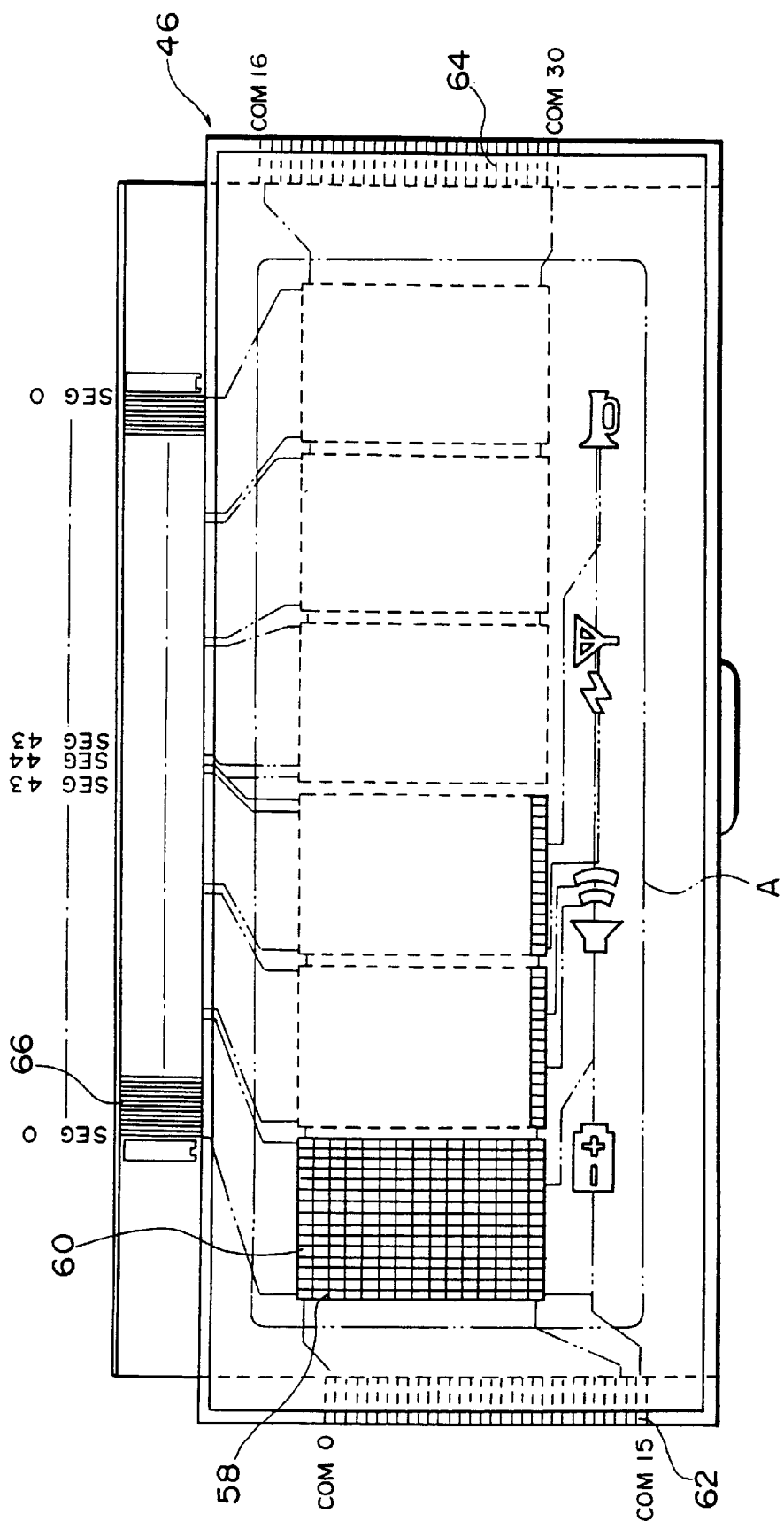
FIG. 9 is a front view of the liquid crystal display device shown in FIGS. 1 and 2.

As shown in FIG. 9, the liquid crystal display panel 46 comprises a plurality of scan electrodes 58 and a plurality of signal electrodes 60, which are disposed into a matrix in a display area A. The terminals 62 and 64 of the scan electrodes 58 are arranged along the opposite sides of the liquid crystal display panel 46, while the terminals 66 of the signal electrodes 60 are arranged along one of the remaining sides of the liquid crystal display panel 46.

Figure 2:
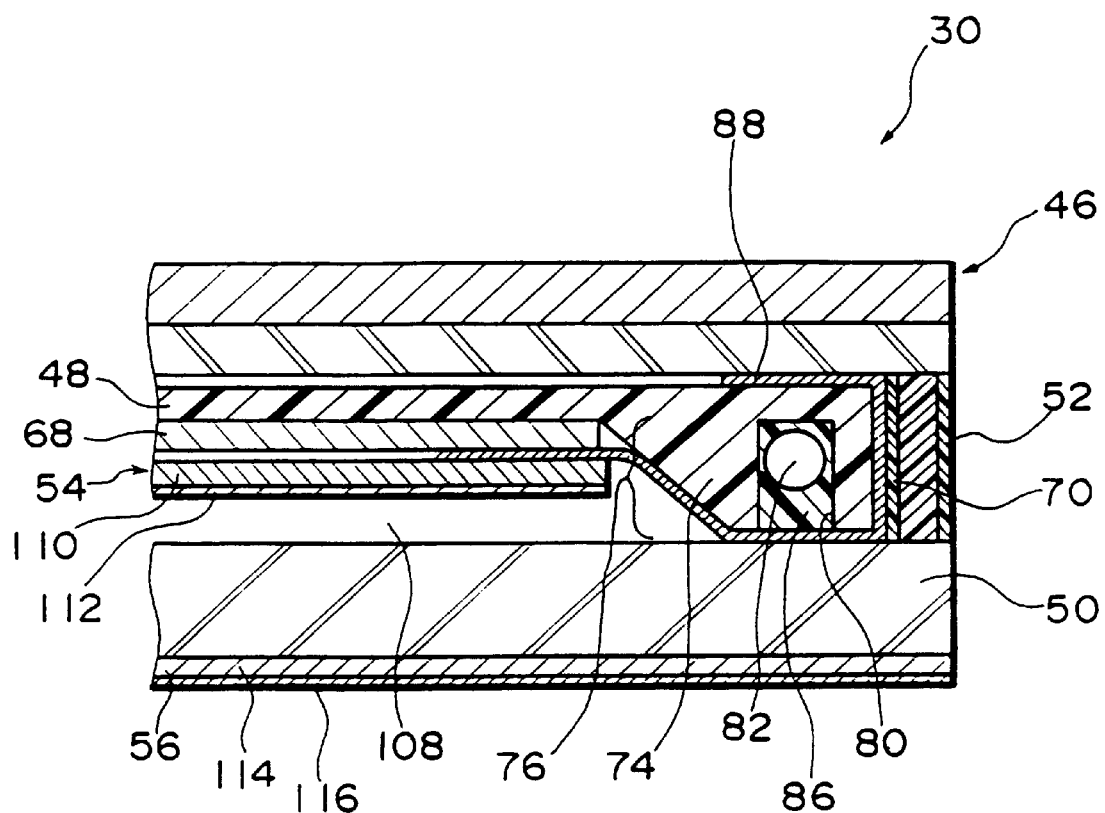
FIG. 2 is a sectional view showing a lamp that is embedded in place in the parts assembly of FIG. 1.
Figure 5:
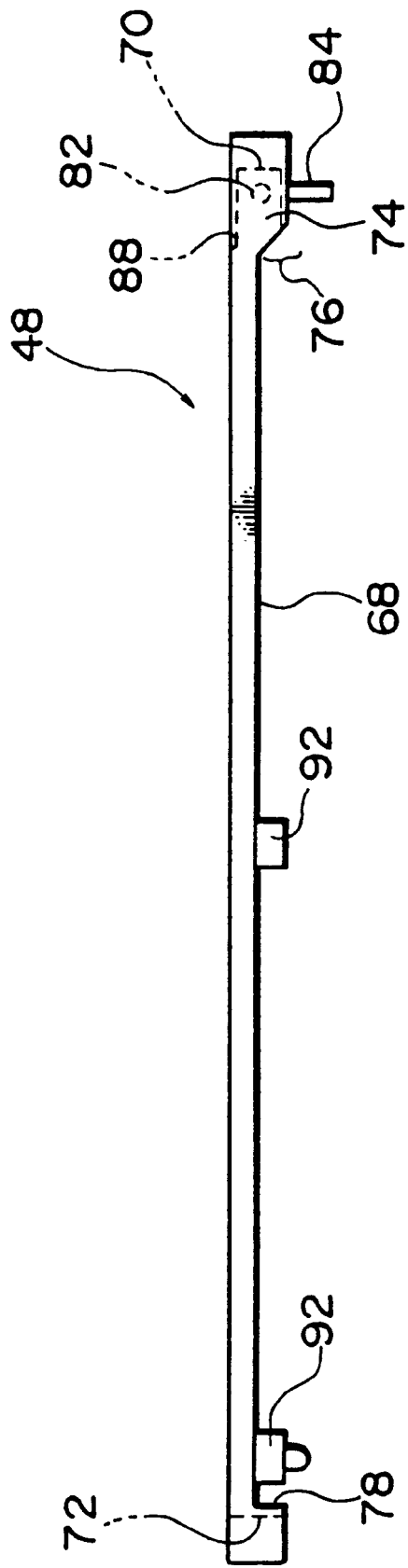
FIG. 5 is a side view as viewed from the direction of arrow VI in FIG. 4.
Figure 6:
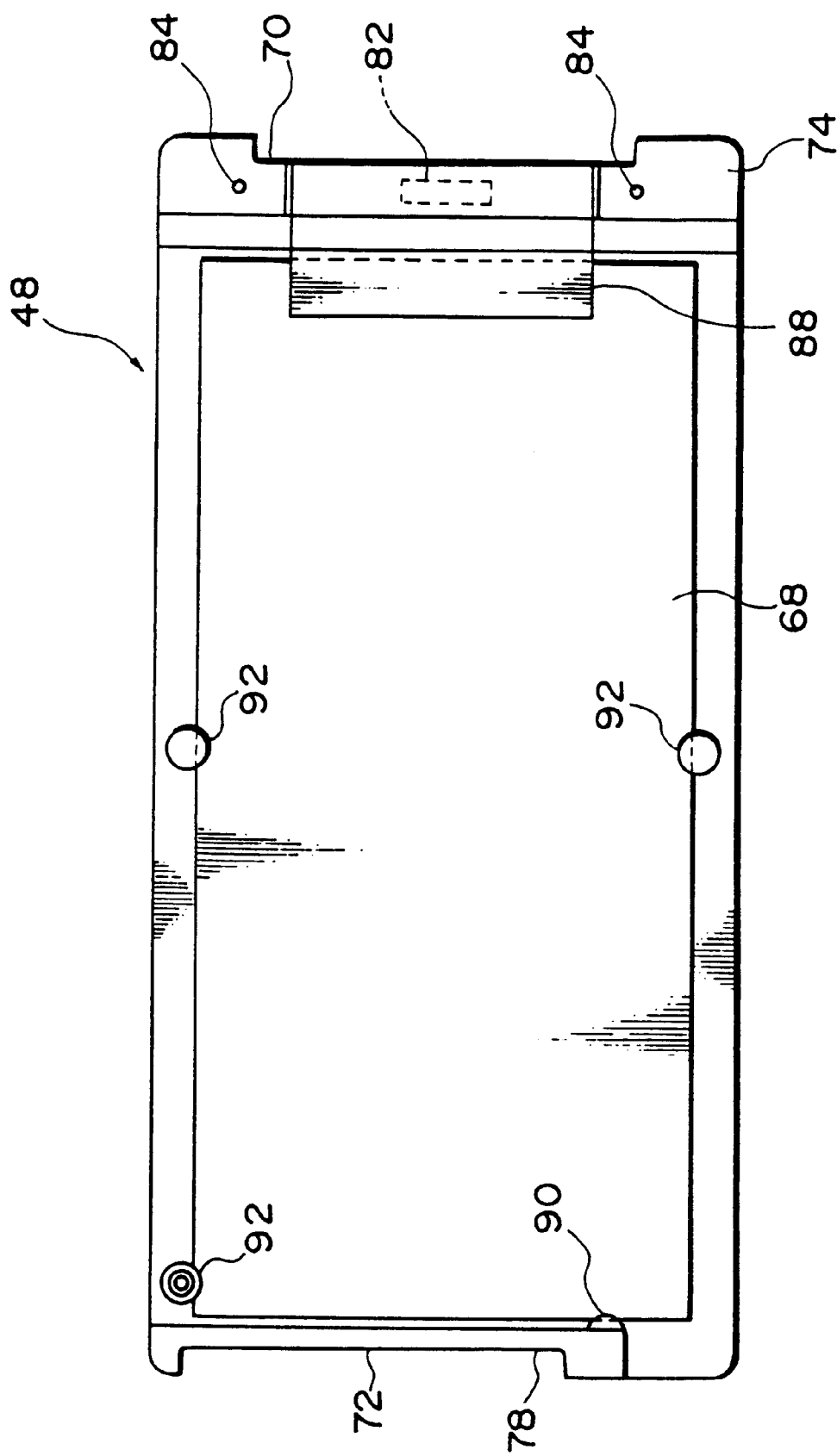
FIG. 6 is a back view of the light guide plate of FIG. 4.
Figure 7:
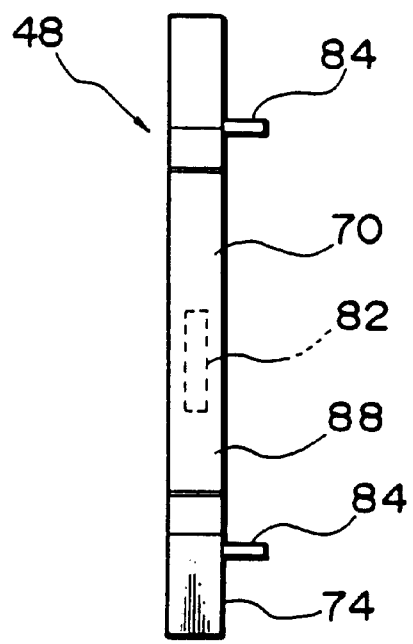
FIG. 7 is a side view as viewed from the direction of arrow VII in FIG. 4.
Figure 8:
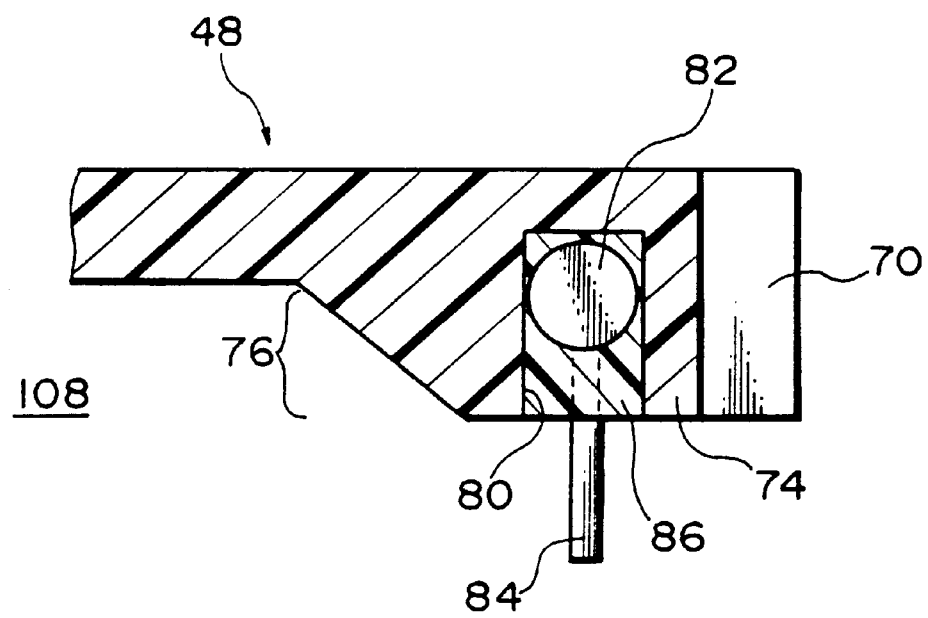
FIG. 8 is a sectional view showing the lamp receiving portion of FIG. 7.

The light guide plate 48 conducts a light from a lamp toward the display area A of the liquid crystal display panel 46 (see FIG. 9), and includes a bottom surface (underside as viewed in FIG. 1) which is formed into a fresnel mirror or the like for diffusing the light radiated from the lamp toward the edge of the liquid crystal display panel to uniformly conduct it onto the overall display area A. As shown in FIGS. 1, 2 and 5, the bottom surface of the light guide plate 48 also includes a reflecting sheet 68 mounted thereon.

The light guide plate 48 further includes positioning portions 70, 72 at each end respectively for positioning the corresponding one of the elastic conductors 52.

Each of the positioning portions 70 and 72 surrounds the corresponding elastic conductor 52 about the three sides thereof, and has a height equal to or lower than that of the elastic conductor 52 when it is in its compressed state.

More particularly, as shown in FIGS. 2 and 4 to 8, one positioning portion 70 is defined by a thick-walled portion 74 that is formed in the light guide plate 48 at one end and has a height equal to or lower than that of the compressed elastic conductor 52. The thick-walled portion 74 is formed with a cut portion which is shaped to match the length and thickness of the elastic conductor 52.

The thick-walled portion 74 extends toward the circuit board 50. Thus, the positioning portion 70 will also include a protrusion 76 extending toward the circuit board.

The other positioning portion 72 is also formed by cutting the other end of the light guide plate 48 to match the length and thickness of the corresponding elastic conductor 52. This positioning portion 72 also includes a protrusion 78 that which extends toward the circuit board 50 along the bottom edge of the cut portion for providing a similar thick-walled portion. As a result, the positioning portion 72 will also be formed with a cut portion which is shaped to match the length and thickness of the corresponding elastic conductor 52.

The thick-walled portion 74 of the light guide plate 48 includes a recess 80 formed therein at its bottom. The recess 48 receives a lamp 82.

The recess 80 has its longitudinally extending sides parallel to the positioning portion 70. The lamp 82 received in the recess 80 has its terminal 84 extending in the downward direction and is embedded in the recess 80 by filling it with an adhesive 86.

The cut portion of the thick-walled portion 74 is covered with a reflecting sheet 88 to avoid any external leakage of the light from the lamp 82 for improving the efficiency of illumination. The reflecting sheet 88 extends from the top surface of the thick-walled portion 74 through the bottom surface of the notched positioning portion 70 to the bottom surface of the light guide plate 48 and is adhered to these surfaces to hold the end of the reflecting sheet 68 that has been applied to the bottom surface of the light guide plate 48.

The protrusion 78 of the positioning portion 72 includes a supporting portion 90 for receiving the end of the reflecting sheet 68. Thus, the supporting portion 90 co-operates with the other reflecting sheet 88 to hold the reflecting sheet 68. Several locking members 92 for holding the reflecting sheet 68 are also integrally formed in the bottom of the light guide plate 48.

Figure 10:
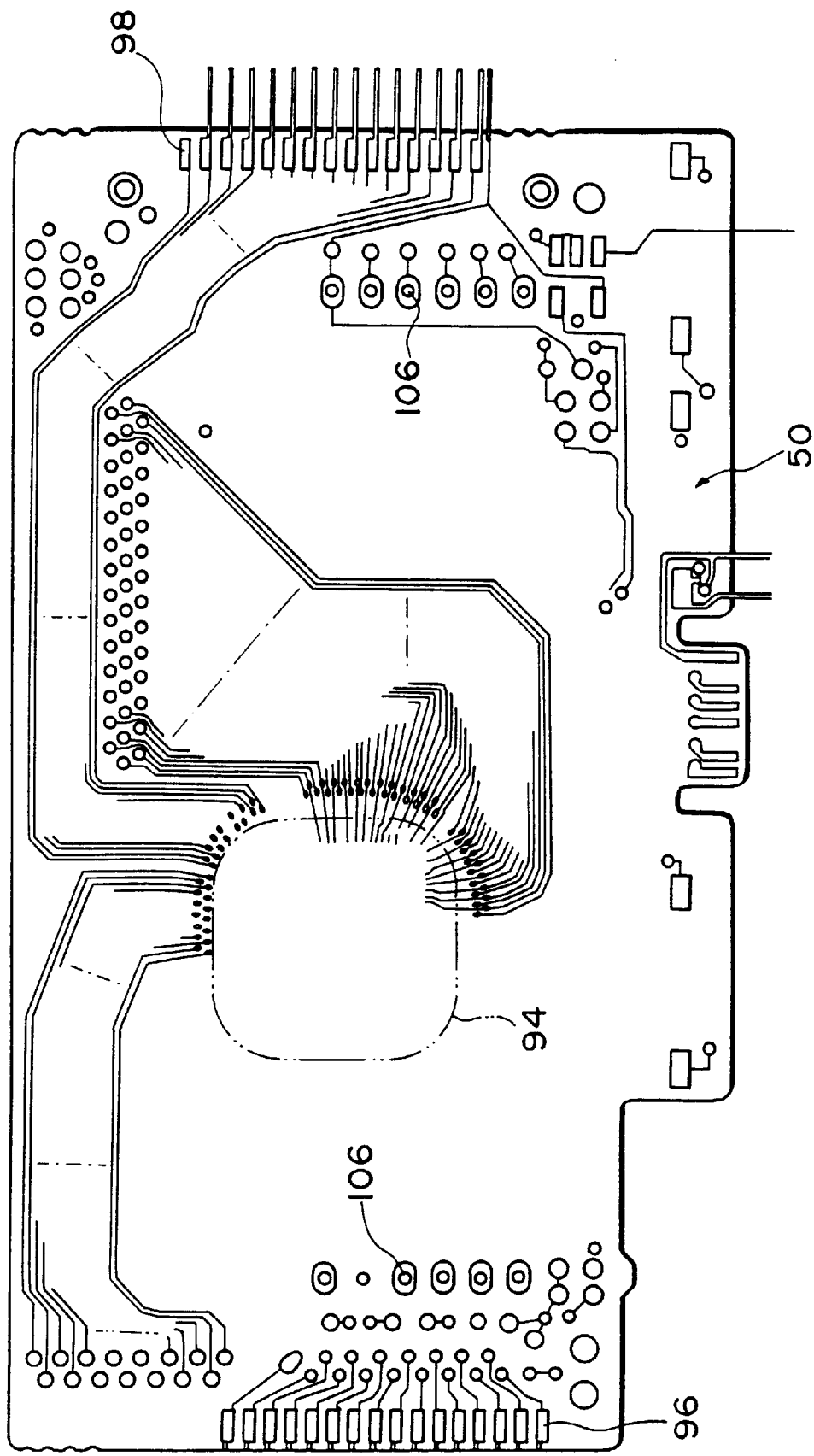
FIG. 10 is a front view of the circuit board shown in FIGS. 1 and 2.
Figure 11:
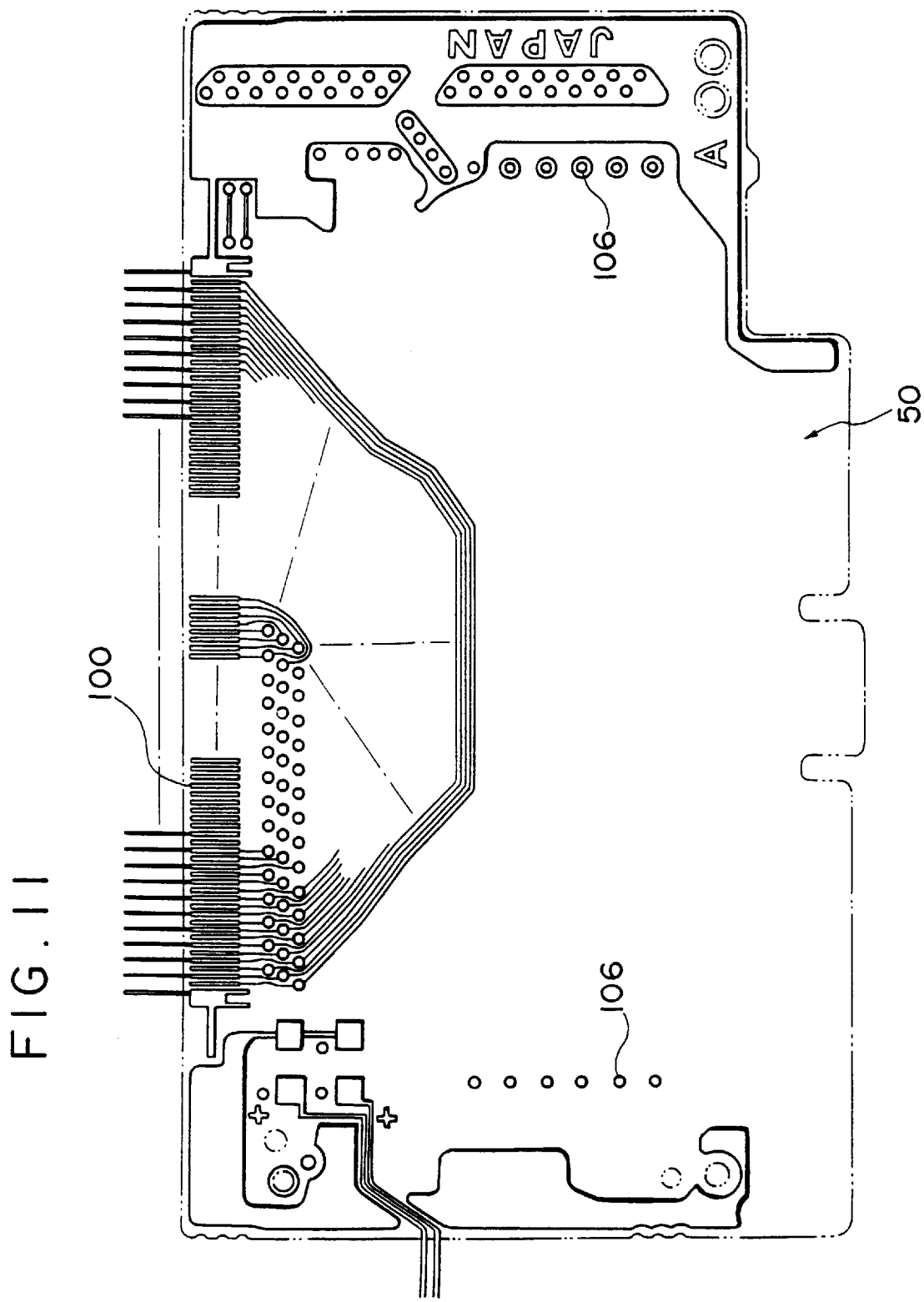
FIG. 11 is a back view of the circuit board shown in FIG. 10.

As shown in FIGS. 1, 10 and 11, the circuit board 50 includes an electrode driver 94 mounted on the top thereof. The electrode driver 94 is connected to drive side scan electrode terminals 96 and 98 that are disposed on the top and bottom surfaces of the circuit board 50 and also to drive side signal electrode terminals 100 that are arranged on the bottom of the circuit board 50 along its one longitudinal side. The drive side signal electrode terminals 100 are respectively connected to the signal electrode terminals 66 on the liquid crystal display panel 46 through a film carrier tape 102.

A plurality of electronic and other parts 104 are mounted on both the top and bottom of the circuit board 50. The bottom of the circuit board 50 also includes insertion terminals 106 inserted into the female connectors 33 of the mother board 32 and so on.

Each of the elastic conductors 52 is used to connect between the scan electrode terminals 96 or 98 of the circuit board 50 and the scan electrode terminals 62 or 64 of the liquid crystal display panel 46. These elastic conductors 52 are disposed on the circuit board 50 at its opposite ends between the liquid crystal display panel 46 and the circuit board 50 such that the elastic conductors 52 are compressed between the liquid crystal display panel 46 and the circuit board 50 while maintaining their conducting state. In such a case, the elastic conductors 52 are horizontally positioned by the positioning portions 70 and 72 on the opposite ends of the light guide plate 48 while reliably avoiding any unnecessary transverse flexion in the compressed elastic conductors 52 since the positioning portions 70 and 72 are formed to have their height equal to or lower than that of the compressed elastic conductors 52, as described. The flex deformation of the elastic conductors 52 to the outward direction can be prevented by the inner walls of the metallic frame 44. The elastic conductors 52 may be formed of any electrically conductive rubber material such as silicone rubber, zebra connector, zebra rubber or the like. In this embodiment, the elastic conductors 52 are preferably formed of the silicone rubber. Alternatively, the elastic conductors 52 may be formed of an anisotropic conductive sheet in which conductive carbon fibers having their diameter between about 3 microns and 20 microns are oriented with high density within an insulation silicone rubber in its thickness direction or another anisotropic conductive sheet in which metal fibers having their diameter between 20 microns and 30 microns are oriented with high density within an insulation silicone rubber in its thickness direction or a flexible printed circuit board (FPC) plated as a connector member and including a core material of insulation silicone sponge rubber.

When the elastic conductors 52 are disposed between the liquid crystal display panel 46 and the circuit board 50 at their opposite ends, the elastic conductors 52 can be uniformly compressed without need of any cushion material as in the prior art. This can reduce the number of parts.

Even if the elastic conductors 52 are disposed between the liquid crystal display panel 46 and the circuit board 50 at their opposite ends, the light from the lamp 82 will not be blocked by the elastic conductors 52 since the lamp 82 is located adjacent the display area of the light guide plate 48 rather than the elastic conductors 52. Thus, the elastic conductors 52 can be arranged on the same side as the lamp 82 is located. This eliminates the limitation relative to the circuit layout and provides a more free circuit layout.

Since the elastic conductors 52 can be disposed on the circuit board 50 at its opposite ends, the number of scan electrode terminals 96 on the circuit board 50 can be increased. As shown in FIG. 9, for example, the liquid crystal display panel 46 may include one group of scan electrode terminals 62 set at COM0–COM15 and the other group of scan electrode terminals 64 set at COM16–COM30, thereby dividing the display area into two controllable sub-areas.

In such a case, the signal electrode terminals 66 on the liquid crystal display panel 46 may be formed into two axisymmetrically divided groups designated SEG0–SEG44, as shown in FIG. 9. If any pair of signal electrode terminals 66 axisymmetrically located on the liquid crystal display panel 46 simultaneously receive the same signal, the capacity of the driver may be reduced one-half to control all the signal electrode terminals 66 even if the number of signal electrode terminals 66 further increases. This enables a more inexpensive driver to control all the electrode terminals in the liquid crystal display device.

For example, the same signal may be simultaneously supplied to two electrode terminals SEG0 and SEG0 on the opposite ends of the signal electrode terminal group 66. A scan signal may be fed to any one of the scan electrode terminal group 62 (e.g., any one of COM0–COM15) while no signal is supplied to the other scan electrode terminal group 64. After a display has been made relating to any one of COM0–COM15, a scan signal is supplied to any one of COM16–COM30. Thus, the display can be made in the two divided display sections through a drive of relatively low capacity.

The first noise-shield sheet 54 is located between the light guide plate 48 and the circuit board 50 to prevent any noise from the circuit board 50 from influencing the receiver section in the mother board 32.

In such a case, the first noise-shield sheet 54 is applied to the bottom of the light guide plate 48 utilizing a space 108 that is formed between the bottom of the light guide plate 48 and the circuit board 50 by the protrusions 76 and 78 in the positioning portions 70 and 72. The first noise-shield sheet 54 may be formed of a flexible printed circuit board (FPC) which comprises an insulating base layer 110 of insulation material such as polyimide polyester or the like and a shield layer 112 formed over the whole insulating layer 110 and of an electrically conductive material such as copper or the like. Such an electrically conductive material may be any other material such as iron, aluminum, silver or the like.

Figure 12:
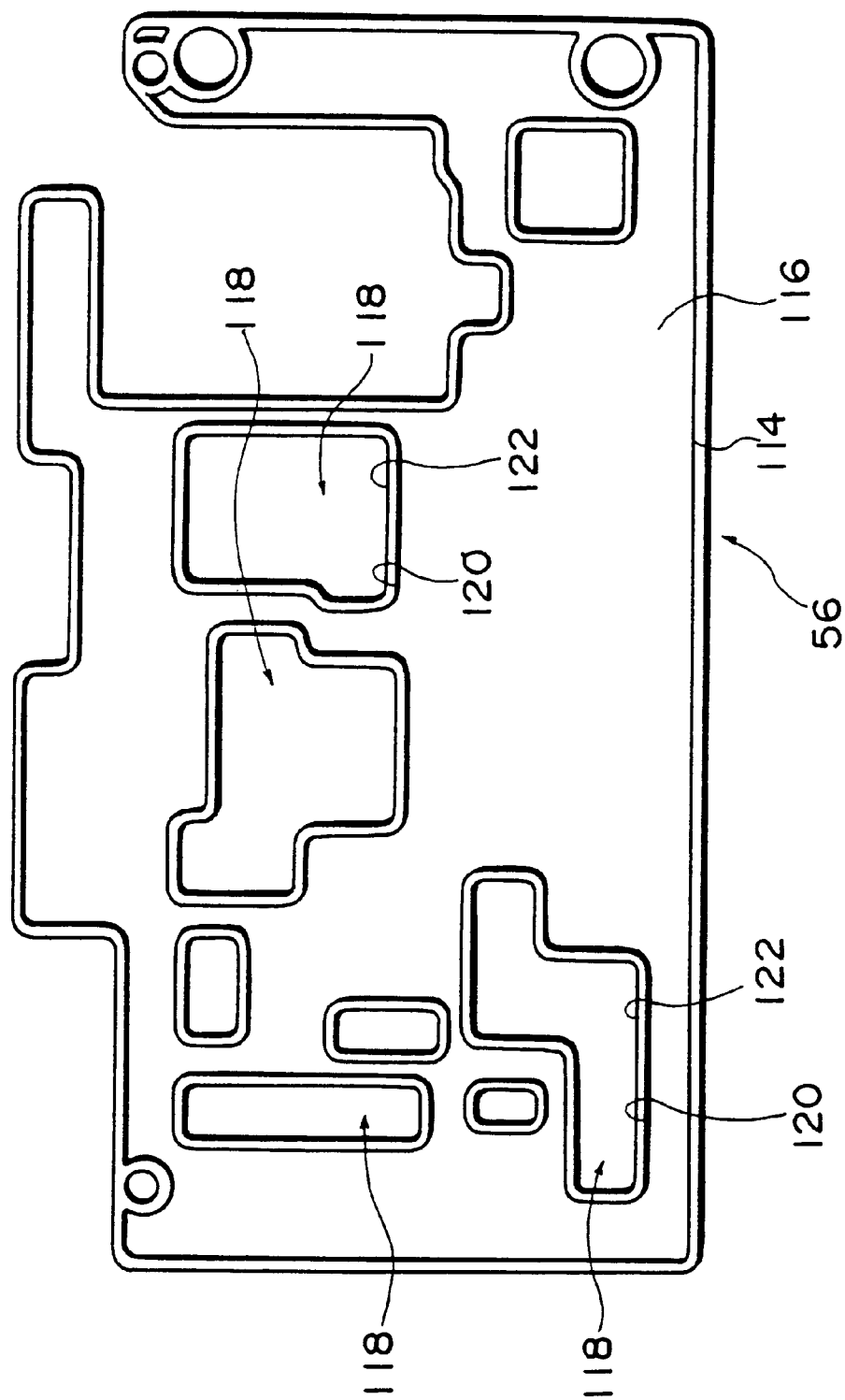
FIG. 12 is a front view of the noise-shield sheet shown in FIGS. 1 and 2.

As shown in FIG. 12, the second noise-shield sheet 56 is similarly formed of a flexible printed circuit board (FPC) 5 which comprises an insulating base layer 114 of insulation material and a shield layer 116 of electrically conductive material formed over the whole insulating layer 114. The second noise-shield sheet 56 includes insertion holes 118 formed therethrough to receive electric components such as the electronic parts on the bottom of the circuit board 50, the insertion terminals 106 to the female connectors 33 of the mother board 32 and so on. The second noise-shield sheet 56 is mounted on the bottom of the circuit board 50.

Each of the insertion hole 118 of the second noise-shield sheet 56 includes a first insertion hole 120 which is formed through the shield layer 116 and finished by etching the punched portions therein and a second insertion hole 122 which is punched through the insulating layer 114 within the portion of the first insertion hole 120 having no shield layer 116 at a portion of the shield layer 116 remote from the edge of the first insertion hole 120.

With provision of the first and second insertion holes 120, 122 in such a manner, the first insertion hole 120 will be larger than the second insertion hole 122. When the electronic parts and insertion terminals 106 are inserted through the insertion holes 118, these parts may contact the edge of the second insertion holes 122, but not contact the first insertion holes 120 larger than the second insertion holes 122. As a result, any short-circuiting between the conductive shield layer 116 and the terminals of the electronic parts can be reliably avoided. This means that the assembly can be more easily made without need of any accurate position in the second noise-shield sheet 56.

Figure 13:
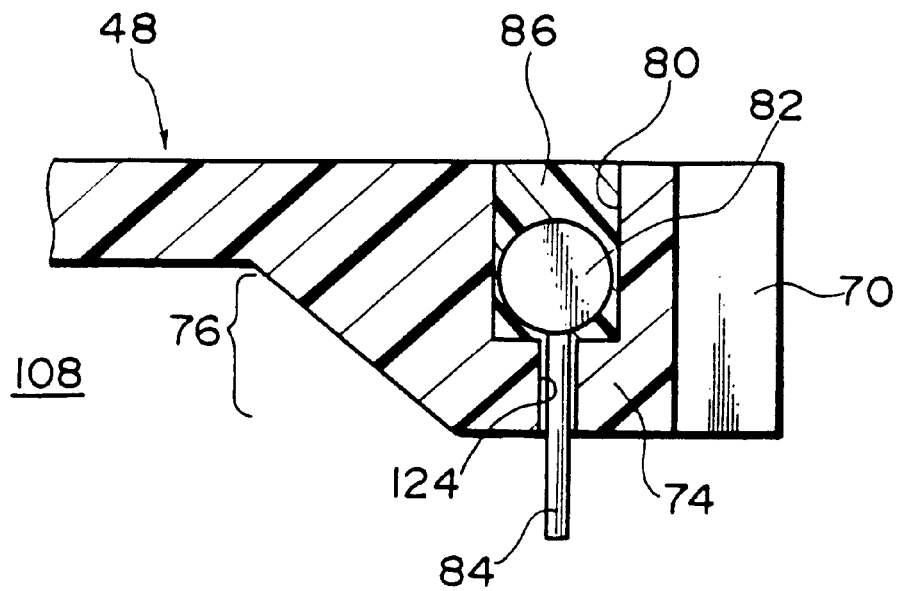
FIG. 13 is a sectional view showing the lamp receiving portion in a light guide plate according to another embodiment of the present invention.

FIG. 13 shows another embodiment of the present invention.

This embodiment includes a recess 80 opened to the top of a thick-walled portion 74 in a light guide plate 48 at one end. The recess 80 includes a terminal insertion hole 124 formed therethrough for receiving a terminal 84 of a lamp 82 which is received within the recess 80. Thus, the lamp 82 can be more easily and reliably positioned within the recess 80.

Figure 14:
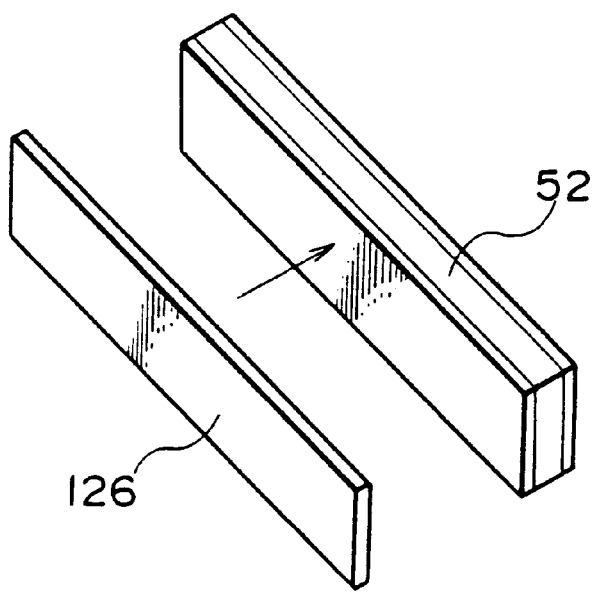
FIG. 14 is a perspective view showing a reflecting sheet according to still another embodiment of the present invention.

FIG. 14 shows a further embodiment of the present invention.

This embodiment includes a reflecting sheet 126 mounted on an elastic conductor 52 at one side. Merely by disposing athe elastic conductor 52 in the corresponding positioning portion 70, the reflecting sheet 126 can be simultaneously located within the liquid crystal display device. This reduces time and labor required to mount the reflecting sheet.

In the embodiment of FIGS. 1 to 12, the reflecting sheet 68 is disposed on the bottom of the light guide plate 48 and locked by the supporting portions 90 and 92. On the other hand, the reflecting sheet 88 is adhered to the end of the light guide plate 48 in which the lamp 82 is embedded and extended into the corresponding positioning portion 70. On the contrary, the embodiment of FIG. 14 is defined such that the elastic conductor 52 has been previously received in the positioning portion 70. If the elastic conductor 52 includes the reflecting sheet 126 adhered to the one side thereof, therefore, the reflecting sheet 126 will be more easily disposed within the positioning portion 70.

Figure 15:
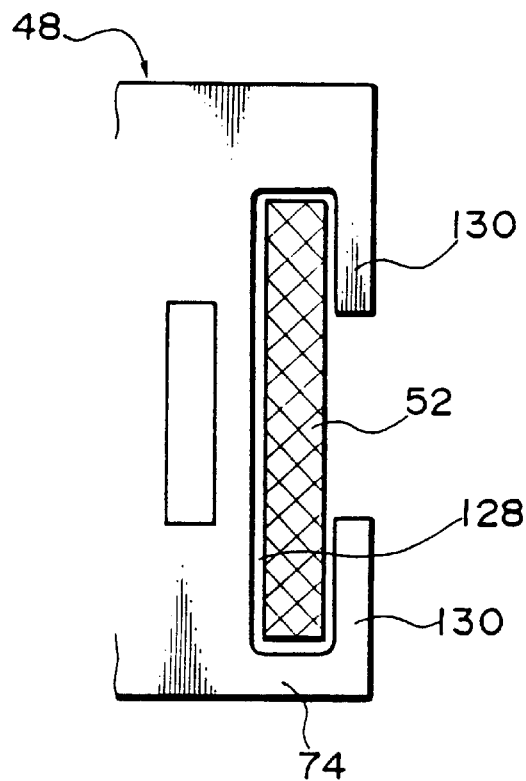
FIG. 15 is a plan view showing a positioning portion in an elastic conductor according to a further embodiment of the present invention.

FIG. 15 shows a further embodiment of the present invention.

This embodiment includes a substantially C-shaped positioning portion 128 cut and formed in a light guide plate 48 at one end. The positioning portion 128 provides a pair of supporting portions 130 for supporting an elastic conductor 52 adjacent its outer ends. Thus, any unnecessary transverse flex deformation in the compressed elastic conductor 52 can be substantially prevented simply by the light guide plate 48. At the same time, the elastic conductor 52 can be more easily incorporated into the liquid crystal display device simply by temporal locking of the elastic conductor 52.

Figure 16:
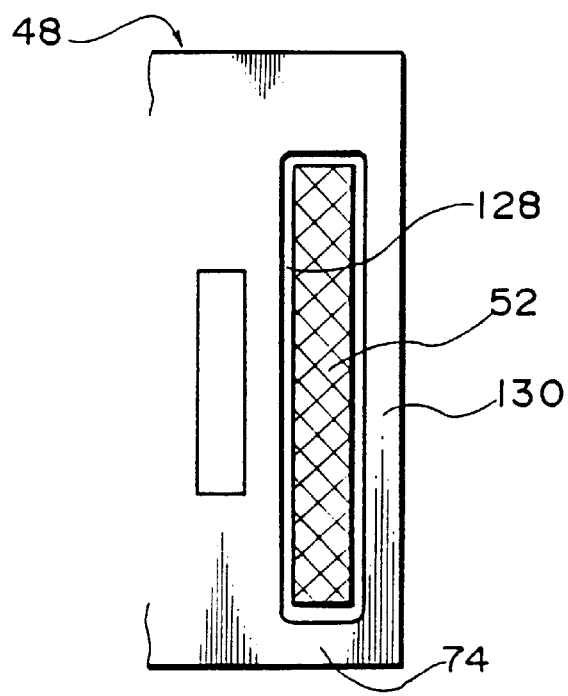
FIG. 16 is a plan view showing a positioning portion in an elastic conductor according to another embodiment of the present invention.

FIG. 16 shows a further embodiment of the present invention.

This embodiment includes a continuous supporting portion 130 and slot-shaped positioning portion 128. Such a continuous supporting portion 130 can more reliably support the elastic conductor 52 on its opposite sides to reliably avoid any unnecessary transverse flex deformation of the compressed elastic conductor 52 and also to positively perform the temporal hold of the elastic conductor 52.

Figure 17:
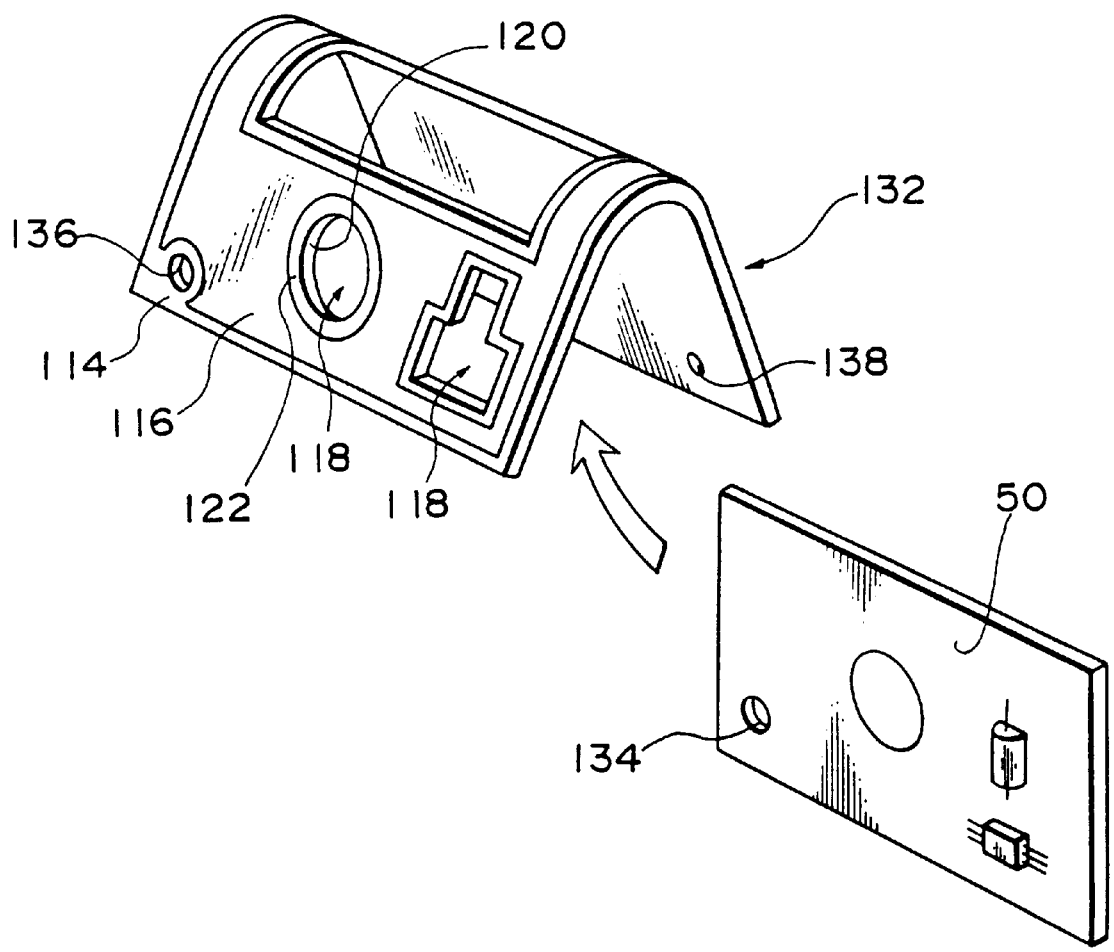
FIG. 17 is a perspective view showing the position of a noise-shield sheet according to still another embodiment of the present invention.
Figure 18:
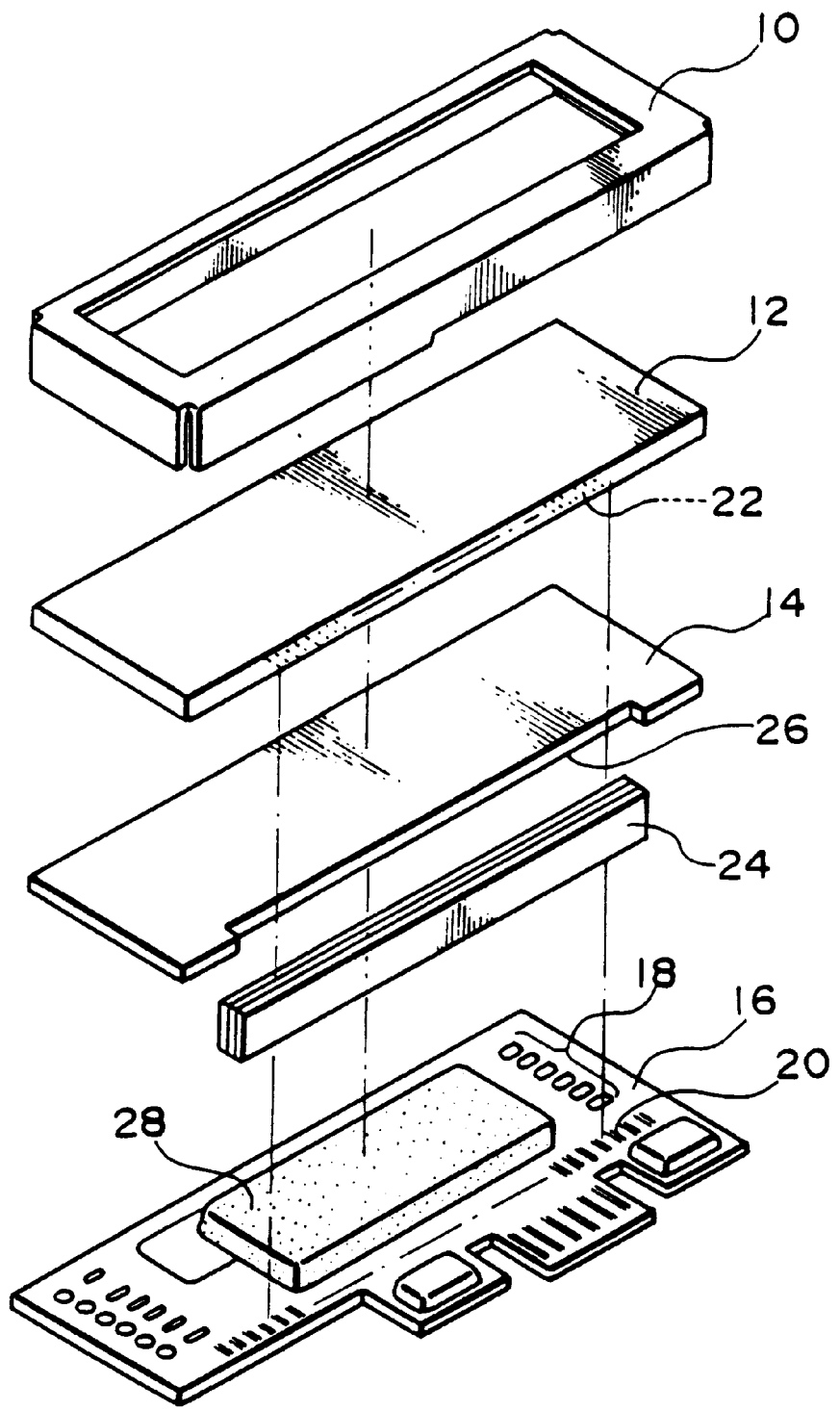
FIG. 18 is an exploded perspective view of a liquid crystal display device according to the prior art.

FIG. 17 shows a further embodiment of the present invention.

This embodiment uses a single noise-shield sheet 132 enclosing the top and bottom surfaces of a circuit board 50 to prevent a creation of noise, in place of the first and second noise-shield sheets 54, 56 in the previous embodiments. In FIG. 17, the backward and forward portions of the noise-shield sheet 132 correspond to the first and second noise-shield sheets 54, 56, respectively. The noise-shield sheet 132 is located to extend to the bottom of the circuit board 50 through a space formed between the positioning portions of the light guide plate 48 which are formed at its opposite ends to position the elastic conductors 52. Thus, the noise-shield sheet 132 can be more easily mounted in the liquid crystal display device without connection between the opposite ends of the noise-shield sheet on the top and bottom surface of the circuit board.

The noise-shield sheet 132 is also formed of FPC and further shaped to have an insertion hole 118 which comprises 1a a first insertion hole 120 formed through the shield layer 116 and a second insertion hole 122 formed through the insulating layer 114 and smaller than the first insertion hole 120. This can prevent any short-circuiting in the electronic parts.

The circuit board 50 further includes a positioning hole 134 while the noise-shield sheet 132 also includes a positioning hole 136 formed therethrough at a position opposite to the positioning hole 134. A guide pin (jig) will be extended through and locked in the positioning holes 134 and 136 to facilitate the positioning.

The bottom of the noise-shield sheet 132 further includes an insulation adhesive 138 applied thereto for facilitating the mounting of the noise-shield sheet 132 on the circuit board.

The present invention is not limited to the aforementioned embodiments, but may be applied in any of various modified forms within the scope of the invention.

For example, the first noise-shield sheet 54 shown in FIGS. 1 to 12 may be formed of any suitable material other than FPC, such as copper foil or the like.

Although the embodiments have been described as to application to the display module in the pager, the present invention may be similarly to applied to any other suitable display module as camera display module or the like.

The present invention is not limited to the cases when the end portion of the light guide plate including the lamp is covered with the reflecting sheet to improve the efficiency in lamp illumination and when the elastic conductor is disposed in the corresponding positioning portion. For example, the reflecting sheet may be replaced by a reflecting paint material which is applied to the end of the light guide plate in which the lamp is included or applied, on one side, to the elastic conductor located within the corresponding positioning portion. Furthermore, all the edge surface of the light guide plate may be covered with the reflecting sheet or the other reflective paint material.

What is claimed is:

1. A liquid crystal display device, comprising:
   a circuit board mounting electric components on the top surface thereof and an electrically conductive pattern on the opposite surface thereof;
   a liquid crystal display panel including a central display area and electrode terminals disposed along the sides thereof and connected to said electrically conductive pattern, said liquid crystal display panel being opposite to said circuit board;
   elastic conductors located and compressed between said circuit board and said liquid crystal display panel to connect said electrically conductive pattern to said electrode terminals;
   a lamp for radiating a light toward said liquid crystal display panel;
   and a light guide plate disposed between said circuit board and said liquid crystal display panel for conducting the light from said lamp toward said central display area; and
   wherein said light guide plate includes positioning portions for positioning said elastic conductors which are formed therein on the opposite ends, said positioning portions having a height equal to or lower than that of said compressed elastic conductors, each of said positioning portions has a protrusion extending therefrom toward said circuit board;
   said lamp is placed between at least one of said positioning portions and said central display area; and
   a noise-shield sheet is located in a space between said light guide plate and circuit board formed by said protrusions.

2. The liquid crystal display device as defined in claim 1, wherein said circuit board and noise-shield sheet include positioning holes formed therethrough at positions opposite to each other.

3. A liquid crystal display device, comprising:
   a circuit board mounting electric components on the top surface thereof and an electrically conductive pattern on the opposite surface thereof;
   a liquid crystal display panel including a central display area and electrode terminals disposed along the sides thereof and connected to said electrically conductive pattern, said liquid crystal display panel being opposite to said circuit board;
   elastic conductors located and compressed between said circuit board and said liquid crystal display panel to connect said electrically conductive pattern to said electrode terminals;
   a lamp for radiating a light toward said liquid crystal display panel;
   a light guide plate disposed between said circuit board and said liquid crystal display panel for conducting the light from said lamp toward said central display area; and
   wherein said light guide plate includes positioning portions for positioning said elastic conductors which are formed therein on the opposite ends, said positioning portions having a height equal to or lower than that of said compressed elastic conductors;
   each of said positioning portions has a protrusion extending therefrom toward said circuit board;
   said lamp is placed between at least one of said positioning portions and said central display area; and
   a noise-shield sheet is angled around said circuit board to shield noise generated from the top and opposite surfaces and one portion of said noise-shield sheet opposite to the top surface is located in a space between said light guide plate and said circuit board formed by said protrusions.

* * * * *